United States Patent
Yu

(10) Patent No.: US 10,515,569 B2
(45) Date of Patent: Dec. 24, 2019

(54) PREPARATION METHOD OF FLEXIBLE DISPLAY AND FLEXIBLE DISPLAY

(71) Applicant: Shenzhen China Star Optoelectronics Semiconductor Display Technology Co., Ltd., Shenzhen (CN)

(72) Inventor: Chengzhong Yu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/032,084

(22) Filed: Jul. 11, 2018

(65) Prior Publication Data

US 2019/0206286 A1    Jul. 4, 2019

Related U.S. Application Data

(63) Continuation of application No. PCT/CN2018/073943, filed on Jan. 24, 2018.

(30) Foreign Application Priority Data

Dec. 29, 2017   (CN) .......................... 2017 1 1498514

(51) Int. Cl.
| | | |
|---|---|---|
| *G09F 9/30* | (2006.01) | |
| *G06F 1/16* | (2006.01) | |
| *H01L 51/00* | (2006.01) | |
| *H01L 27/32* | (2006.01) | |
| *C08J 5/18* | (2006.01) | |

(52) U.S. Cl.
CPC ............ *G09F 9/301* (2013.01); *G06F 1/1652* (2013.01); *H01L 51/0097* (2013.01); *C08J 5/18* (2013.01); *H01L 27/3258* (2013.01)

(58) Field of Classification Search
None
See application file for complete search history.

(56) References Cited

U.S. PATENT DOCUMENTS

| | | | |
|---|---|---|---|
| 2009/0272562 A1 | 11/2009 | Yoshioka et al. | |
| 2011/0292310 A1 | 12/2011 | Sato et al. | |
| 2015/0075706 A1* | 3/2015 | Cheng ................. | H01L 21/6835 156/247 |

(Continued)

FOREIGN PATENT DOCUMENTS

| | | |
|---|---|---|
| CN | 101284980 A | 10/2008 |
| CN | 102763195 A | 10/2012 |

(Continued)

*Primary Examiner* — Reema Patel
*Assistant Examiner* — Steven M Christopher

(57) ABSTRACT

The present disclosure provides a preparation method of a flexible display and a flexible display, and the method may include: coating an adhesive on a first surface of a first substrate to form an adhesive layer; bonding the first substrate on the second substrate by the adhesive layer on the first surface; providing a flexible display body on the second surface of the first substrate; separating the second substrate from the first substrate by a hygroscopic swelling to obtain the flexible display. By the above-mentioned method, a preparation process flow may be simplified, and the product quality may be improved.

19 Claims, 3 Drawing Sheets

(56) References Cited

U.S. PATENT DOCUMENTS

| | | | |
|---|---|---|---|
| 2016/0021732 A1 | 1/2016 | Zhou | |
| 2016/0026022 A1* | 1/2016 | Jung | G02F 1/133634 349/96 |
| 2016/0315276 A1 | 10/2016 | Seol et al. | |
| 2019/0113207 A1* | 4/2019 | Palmer | F21V 9/30 |

FOREIGN PATENT DOCUMENTS

| | | | |
|---|---|---|---|
| CN | 104317131 A | | 1/2015 |
| CN | 103740317 B | * | 7/2015 |
| CN | 106297967 A | | 1/2017 |
| CN | 106448473 A | | 2/2017 |
| CN | 106847862 A | | 6/2017 |
| WO | WO2011015376 A1 | | 2/2011 |

* cited by examiner

PREPARATION METHOD OF FLEXIBLE DISPLAY AND FLEXIBLE DISPLAY

CROSS-REFERENCE TO RELATED APPLICATIONS

The present application is a continuation-application of International (PCT) Patent Application No. PCT/CN2018/073943, field on Jan. 24, 2018, which claims foreign priority of Chinese Patent Application No. 201711498514.4, field on Dec. 29, 2017 in the State Intellectual Property Office of China, the entire contents of which are hereby incorporated by reference.

FIELD

The described embodiments relate to a technology of a preparation method of a flexible display, and more particularly, to a preparation method of a flexible display and a flexible display.

BACKGROUND

In recent years, flexible displays have been widely used due to their many advantages such as an impact resistance, a strong shock resistance, a light weight, a small size, and more convenient carrying.

In a preparation process of a display substrate of a flexible display, it is usually required to bond the flexible substrate to a hard and flat carrier substrate. Then providing a display structure consisting of film layers and the like on the flexible substrate. Finally, peeling off a completed flexible display substrate from the carrier substrate. In order to avoid misalignment between the electronic components, it is necessary to accurately fix a position and a flatness of the flexible display substrate during the preparation process of display components. It requires that the flexible substrate may be firmly bonded to the carrier substrate, and the flexible substrate may be easily detached from the carrier substrate, when the flexible display substrate is peeled off from the carrier substrate after the preparation process is completed.

In long-term research and development, the Applicant of the present disclosure found that, in a related preparation method of a flexible display, firmly bonding between the flexible substrate and the carrier substrate, and easily peeling off both of them after completing the preparation process, cannot be ensured at the same time, and result in a poor product quality.

SUMMARY

The present disclosure provides a preparation method of a flexible display and a flexible display to solve the technical problem. A flexible display body and a second substrate may be firmly bonded, and after preparing a flexible display body is completed, it may be easy to peel off from the second substrate, so that a preparation process may be simplified, and the product quality may be improved.

In order to solve the above-mentioned technical problem, a technical solution adopted by the present disclosure is to provide a preparation method of a flexible display comprising: providing a first substrate comprising a first surface and a second surface opposite to the first surface, and providing a second substrate comprising a third surface, wherein the first substrate is smaller than the second substrate; coating an adhesive on the first surface of the first substrate to form an adhesive layer, wherein the adhesive comprises silicon-modified polyurethane prepolymer, a hydrophilic plasticizer, a mixed filler, and a silane coupling agent; bonding the first substrate on the third surface of the second substrate by the adhesive layer on the first surface; providing a flexible display body on the second surface of the first substrate; separating the second substrate from the first substrate by a hygroscopic swelling to obtain the flexible display; the hydrophilic plasticizer being polypropylene glycol 2000; the mixed filler comprising: nano calcium carbonate and heavy calcium carbonate, wherein the adhesive layer has a thickness of 3-10 micrometers; a material of the first substrate being at least one of polyimide, polyethylene naphthalate, polyethylene terephthalate, a fiber reinforced plastic, a polyether sulfone resin, polyarylate, and polycarbonate; the second substrate being at least one of a glass substrate, a metal substrate, a quartz substrate, and an organic substrate.

In order to solve the above-mentioned technical problem, a technical solution further adopted by the present disclosure is to provide a preparation method of a flexible display comprising: providing a first substrate comprising a first surface and a second surface opposite to the first substrate, and providing a second substrate comprising a third surface, wherein the first substrate is smaller than the second substrate; coating an adhesive on the first surface of the first substrate to form an adhesive layer, and the adhesive comprising silicon-modified polyurethane prepolymer, a hydrophilic plasticizer, a mixed filler, and a silane coupling agent; bonding the first substrate on the third surface of the second substrate by the adhesive layer on the first surface; providing a flexible display body on the second surface of the first substrate; separating the second substrate from the first substrate by a hygroscopic swelling to obtain the flexible display.

In order to solve the above-mentioned technical problem, a technical solution further adopted by the present disclosure is to provide a flexible display prepared by a preparation method, wherein the preparation method comprises: providing a first substrate comprising a first surface and a second surface opposite to the first substrate, and providing a second substrate comprising a third surface, wherein the first substrate is smaller than the second substrate; coating an adhesive on the first surface of the first substrate to form an adhesive layer, and the adhesive comprising silicon-modified polyurethane prepolymer, a hydrophilic plasticizer, a mixed filler, and a silane coupling agent; bonding the first substrate on the third surface of the second substrate by the adhesive layer on the first surface; providing a flexible display body on the second surface of the first substrate; separating the second substrate from the first substrate by a hygroscopic swelling to obtain the flexible display.

Advantages of the disclosure may follow. As compared with the related art, the present disclosure provides bonding the first substrate on the third surface of the second substrate by the adhesive layer on the first surface and providing a flexible display body on the second surface of the first substrate, so that the flexible display may be firmly bonded with the second substrate. The adhesive used in the adhesive layer may have a property of hygroscopic swelling, an internal structure of the adhesive layer may be broken after absorbing water, and a bonding force between the first substrate and the second substrate may become weakened, so that it may be easy to fast and efficiently peel off the first substrate and the second substrate of the flexible display, and the preparation process may be simplified, and the product quality may be improved.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

Figure 1:
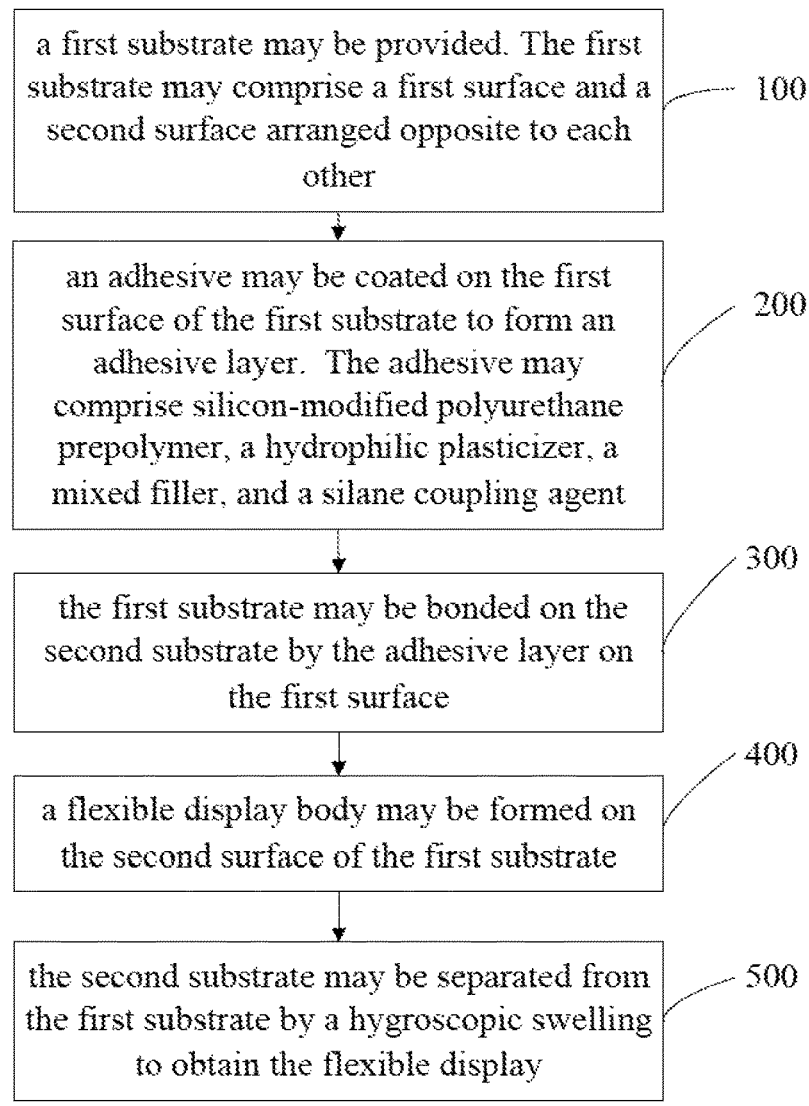
FIG. 1 is a flow chart of a preparation method of a flexible display in accordance with an embodiment in the present disclosure.
Figure 2:
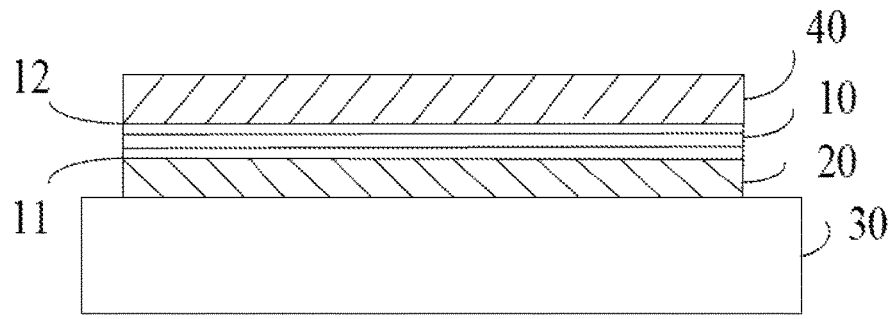
FIG. 2 is a schematic diagram illustrating a first state of the flexible display during a preparation in the present disclosure.

Referring to FIG. 1 and FIG. 2, FIG. 1 is a flow chart of a preparation method of a flexible display in accordance with an embodiment in the present disclosure. FIG. 2 is a schematic diagram illustrating a first state of the flexible display during a preparation in the present disclosure. The method may comprise:

Block S100: a first substrate may be provided. The first substrate may comprise a first surface and a second surface to the first substrate.

Block S200: an adhesive may be coated on the first surface of the first substrate to form an adhesive layer. The adhesive may comprise silicon-modified polyurethane prepolymer, a hydrophilic plasticizer, a mixed filler, and a silane coupling agent.

In the block S200, an adhesive may be coated on the first surface 11 of the first substrate 10 to form an adhesive layer 20. The adhesive may cover an entire area of the first surface 11 and may also cover a part of the first surface 11 on the premise of ensuring an adhesive effect, e.g., the adhesive may be coated on a center position and on four edge positions of the first surface 11. The adhesive covering the part of the first surface 11 may reduce a amount of the adhesive used and may reduce the cost, and may also prevent the excessive adhesive from overflowing during an extrusion process and affect the product quality.

Further, the adhesive may comprise silicon-modified polyurethane prepolymer, a hydrophilic plasticizer, a mixed filler, and a silane coupling agent. The silicon-modified polyurethane prepolymer as a raw material, and the hydrophilic plasticizers, the mixed filler, and the silane coupling agent may be added to prepare the adhesive under an action of a catalyst. Therefore, the first substrate coated with the adhesive may be bonded to other structures.

Block S300: the first substrate may be bonded on the second substrate by the adhesive layer on the first surface.

In the block S300, the second substrate 30 may be bonded on the adhesive layer 20, so that the second substrate 30 may attach to the first substrate 10. In an embodiment, contact surfaces of the first substrate 10 and the second substrate 30 may be different in size, and may be firmly bonded by at least one of an extrusion and a heating manner.

Block S400: a flexible display body may be provided on the second surface of the first substrate.

In the block S400, the first substrate 10 and the second substrate 20 may be bonded together and may be placed on a screen. The second substrate 20 may contact with the screen. A flexible display body 40 may be provided on the second surface 12 of the first substrate 10. The flexible display body 40 may comprise a thin-film transistor (TFT) array layer, an organic light-emitting diode layer, a packaging layer, and the like.

Block S500: the second substrate may be separated from the first substrate by a hygroscopic swelling to obtain the flexible display.

In the block S500, the first substrate 10 and the second substrate 30 are connected by the adhesive layer 20, the adhesive may have a hygroscopic swelling property and may swell after absorbing moisture. An internal structure of the adhesive may be broken when the adhesive contacts with the water, so that a bonding force between the first substrate 10 and the second substrate 30 may be weakened, and the first substrate 10 may be peeled off fast and efficiently from the second substrate 30. Further, the first substrate 10 and the flexible display body 40 obtained may be cut to obtain a flexible display in a required size.

In the above-mentioned embodiment, by bonding the first surface 11 of the first substrate 10 on the second substrate 30 by the adhesive layer and providing the flexible display body on the second surface 12 of the first substrate 10, so that the flexible display may be firmly bonded with the second substrate 30. The adhesive used in the adhesive layer may have a property of hygroscopic swell, the internal structure of the adhesive layer may be broken after absorbing moisture, and a bonding force between the first substrate 10 and the second substrate 30 may become weakened, so that it may be easy to fast and efficiently peel off the first substrate 10 and the second substrate 30 of the flexible display, and the preparation process may be simplified, and the product quality may be improved.

The hydrophilic plasticizer may be polypropylene glycol. In an embodiment, the hydrophilic plasticizer may be polypropylene glycol 2000. Because the hydrophilic plasticizer may have the hygroscopic swelling property, after the adhesive made of the polypropylene glycol 2000 as the hydrophilic plasticizer absorbing moisture, the internal structure of the adhesive made of the polypropylene glycol 2000 as the hydrophilic plasticizer may be broken. A bonding force of the adhesive may be weakened, and the first substrate 10 may be peeled off fast and efficiently from the second substrate 30. Further, the mixed filler may comprise nano calcium carbonate and heavy calcium carbonate. The adhesive layer may have a thickness of 3-10 micrometers, e.g., 3 micrometers, 5 micrometers, 7 micrometers, or 10 micrometers. When the thickness of the adhesive layer is too large, it may not only increase the cost but also cause unnecessary waste. Excess adhesive may also overflow during the extrusion process, and the product quality may be affected. When the thickness of the adhesive layer 20 is too small, the bonding force between the first substrate 10 and the second substrate 30 may be weak, and an position accuracy of each element provided on the first substrate 10 may be affected. In an embodiment, the adhesive layer 20 may have the thickness of 5 micrometers.

In an embodiment, a mass percentage of the silicon-modified polyurethane prepolymer may be 25-30%, e.g., 25%, 26%, 27%, 28%, 29%, or 30%; a mass percentage of the polypropylene glycol 2000 may be 15%-20%, e.g., 15%, 16%, 17%, 180%, 19%, or 20%; and a mass percentage of the nano calcium carbonate and heavy calcium carbonate may be 500-60%, e.g., 50%, 52%, 54%, 56%, 58%, or 60%. Further, a mass percentage of the nano calcium carbonate may be 0%-50%, e.g., 0%, 10%, 20%, 30%, 40%, or 50%; a mass percentage of the silane coupling agent may be 0-2%, e.g., 0.5%, 1%, 1.5%, or 2%. The adhesive may further comprise a antioxidant, and a mass percentage of the antioxidant may be 0-1%, e.g., 0%, 0.4%, 0.6%, 0.8%, or 1%. The antioxidant may be butylated toluene, etc. The adhesive having different components may not only firmly bond the first substrate 10 and the second substrate 30, but also may peel off the second substrate 30 from the flexible display body by the hygroscopic swelling property. It may not only simplify the preparation process, but also may improve the product quality.

Figure 3:
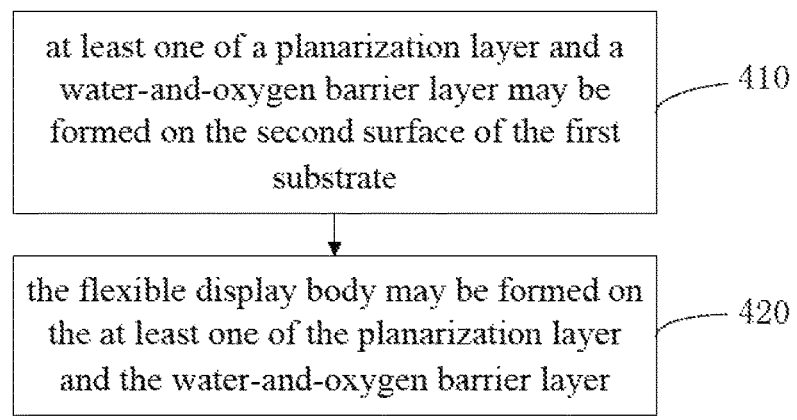
FIG. 3 is a flow chart of a block S400 in FIG. 1 in accordance with an embodiment in the present disclosure.
Figure 4:
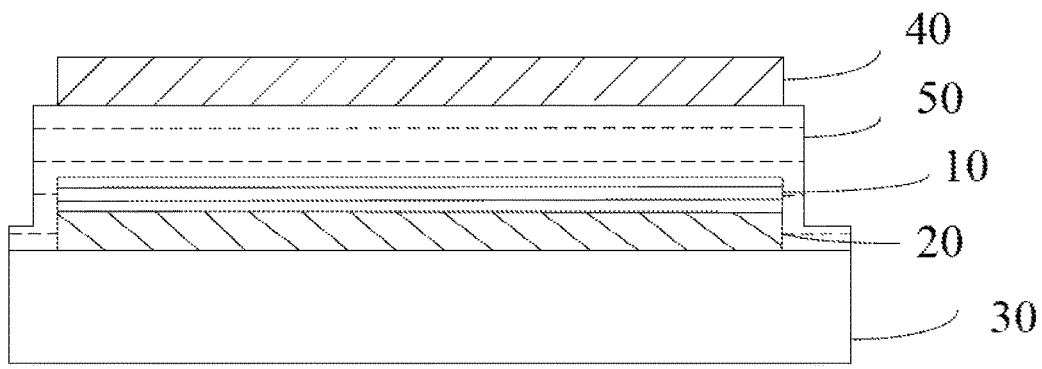
FIG. 4 is a schematic diagram illustrating a second state of the flexible display during the preparation in the present disclosure.

In an embodiment, referring to FIG. 3 and FIG. 4. FIG. 3 is a flow chart of a block S400 in FIG. 1 in accordance with an embodiment in the present disclosure. The method in FIG. 1 may comprise:

Block S410: at least one of a planarization layer and a water-and-oxygen barrier layer may be provided on the second surface of the first substrate.

In the block S410, between the flexible display body 40 and the second surface 12 of the first substrate 10, a water-oxygen barrier layer 50 may be provided, or a planarization layer 50 may be provided, or both. It may be provided according to an actual preparation. The water-oxygen barrier layer may be an alternating structure made of organic/inorganic materials, or may be an alternate structure made of inorganic/inorganic materials. The organic/inorganic material may have the alternate structure in a parylene/silicon nitride/parylene/silicon nitride manner. The alternate structure of inorganic/inorganic material may have the alternate structure in a silicon nitride/silicon dioxide/silicon nitride manner. The water-oxygen barrier layer may prevent moisture, dust and other impurities from entering the flexible display body, causing a problem of shortened service life of the flexible display. The planarization layer may be an organic material such as polyimide. A purpose of adding the planarization layer may be mainly to provide a relatively smooth surface when the first substrate is formed of a material with a rough surface, so as to meet requirements for the product quality, e.g., OLEDs with a surface requirement that a roughness is less than 5 nm.

Block S420: the at least one of the flexible display body may be provided on the planarization layer and the water-and-oxygen barrier layer.

In the block S420, the at least one of the planarization layer and the water-and-oxygen barrier layer 50 may be attached on the second surface 12 of the first substrate 10, or the at least one of the planarization layer and the water-and-oxygen barrier layer 50 may cover the first substrate 10. Further, the at least one of the planarization layer and the water-and-oxygen barrier layer 50 may cover the first substrate 10 and the adhesive layer 20, to form a covered structure. It may prevent moisture, dust and other impurities from entering the flexible display body, and may extend the service life of the flexible display.

Figure 5:
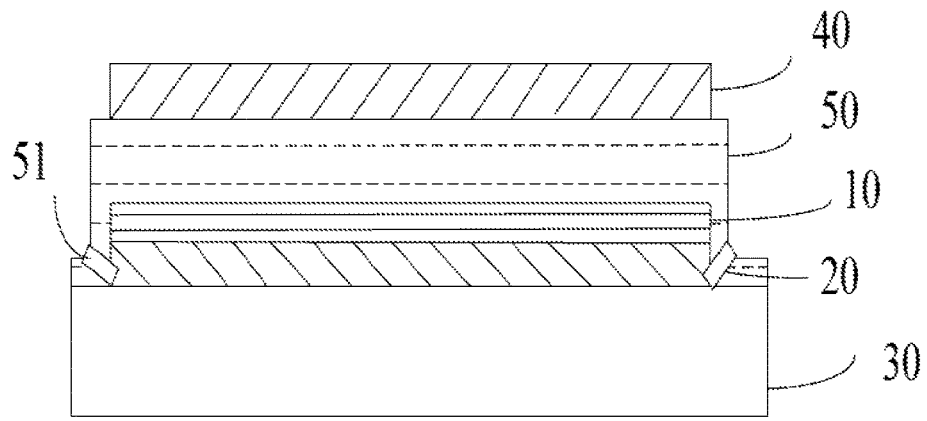
FIG. 5 is a schematic diagram illustrating a third state of the flexible display during the preparation in the present disclosure.

In an embodiment, the second substrate 30 may be separated from the first substrate 10 by the hygroscopic swelling. Before the flexible display is obtained, it may comprise that: the adhesive layer may be partially or entirely exposed through an opening, and may further contact with water and may swell by absorbing moisture to peel off the second substrate from the flexible display. In an embodiment, referring to FIG. 5, the at least one of the planarization layer and the water-and-oxygen barrier layer 50 at a edge of the first substrate 10 may be cut to form an incision 51 having an angle with the second surface of the first substrate 10. The incision 51 may expose the adhesive layer 20 in whole or in a part, so as to be able to contact with water and swell by absorbing moisture to peel off the second substrate 30 from the flexible display. Further, the angle of incision may be 30-60 degrees, e.g., 30 degrees, 40 degrees, 50 degrees, or 60 degrees. In other embodiment, referring to FIG. 6, by an opening 31 penetrating the second substrate 30, the opening 31 may expose the adhesive layer 20 in whole or in a part, so as to be able to contact with water and swell by absorbing moisture to peel off the second substrate 30 from the flexible display. The above-mentioned two kind of openings may also be arranged at the same time to obtain a better moisture absorption and swelling effect.

In an embodiment, the second substrate 30 may be separated from the first substrate 10 by the hygroscopic swelling to obtain the flexible display, wherein it may comprise: the second substrate 30 may be separated from the first substrate 10 by injecting water to an exposed portion of the adhesive layer via the opening. The second substrate 30 and a combination of the flexible display (the combination may comprise the second substrate 30, the adhesive layer 20, and the flexible display body 40) may also be submerged in water, so that the second substrate 30 may be separated from the first substrate 10 to obtain the flexible display.

By submerging the combination of the second substrate 30 and the flexible display in water, the adhesive layer may fully contact with water, and the moisture absorption and swelling may be rapidly performed. It may be easier to separate the second substrate 30 and the first substrate 10. Further, a temperature of the water may be 40-60° C., e.g., 40° C., 50° C., or 60° C. It may use warm water to speed up the moisture absorption and swelling of the adhesive layer, and may further improve a speed of separating the second substrate 30 and the first substrate 10. A submerging time may be 1-20 minutes, e.g., 1 minute, 5 minutes, 10 minutes, 15 minutes, or 20 minutes. For the same combination of the second substrate 30 and the flexible display, the temperature of the water is higher, and a processing time may be shorter.

In other embodiment, a porous structure penetrating the second substrate may be arranged on the second substrate 30. The opening 31 may be evenly distributed on the second substrate, which may cause the adhesive layer to full contact with water during absorbing moisture and swelling. The structure of the adhesive may be rapidly destroyed, and a speed of peeling off the first substrate 10 and the second substrate 30 may be increased.

Figure 6:
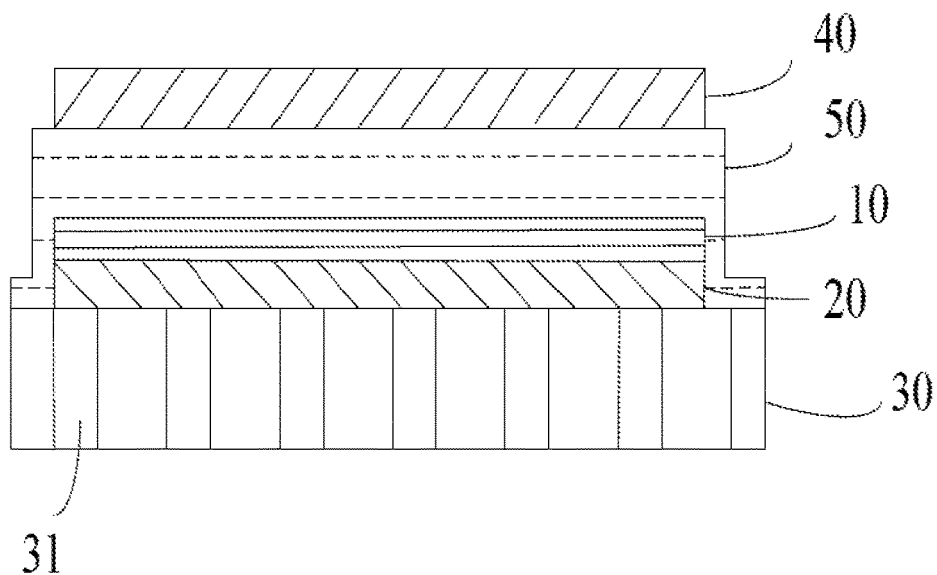
FIG. 6 is a schematic diagram illustrating a fourth state of the flexible display during the preparation in the present disclosure.
Figure 7:
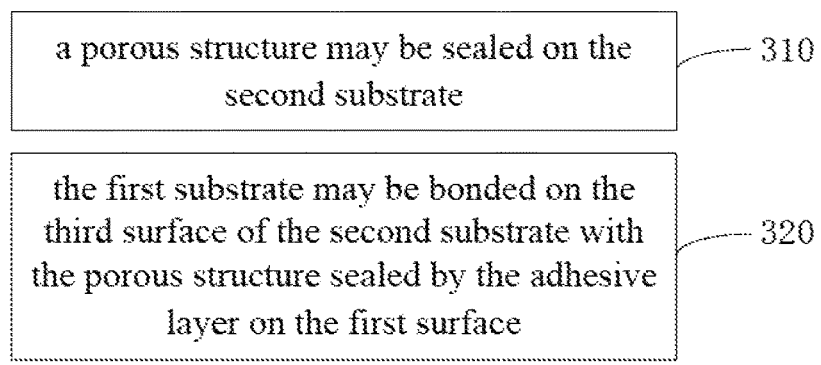
FIG. 7 is a flow chart of a block S300 in FIG. 1 in accordance with an embodiment in the present disclosure.

Further, referring to FIG. 7 and FIG. 6, FIG. 7 is a flow chart of a block S300 in FIG. 1 in accordance with an embodiment in the present disclosure. The method in FIG. 1 may comprise:

Block S310: a porous structure may be sealed on the second substrate.

In the block S310, when the opening 31 on the second substrate 30 is sealed, it may use different sealing methods and sealing materials, as long as it may play a sealing role, and may provide a flat, firm contact surface for the first substrate 10.

Block S320: the first substrate may be bonded on the second substrate with the porous structure sealed by the adhesive layer on the first surface.

Further, when the second substrate 30 is the porous structure, the second substrate 30 may be separated from the first substrate 10 by the hygroscopic swelling. Before the flexible display is obtained, it may comprise that: the porous structure on the second substrate may be unsealed after bonding. After the unsealing is performed, the opening 31 may expose the adhesive layer 20 and may be further contact with water and swell by absorbing moisture, thereby the second substrate 30 may be peeled off from the flexible display.

In an embodiment, the first substrate 10 may be a flexible substrate. A material of the flexible substrate may be at least one of polyimide, polyethylene naphthalate, polyethylene terephthalate, a fiber reinforced plastic, a polyether sulfone resin, polyarylate, and polycarbonate. The flexible substrate using the flexible display body may be more flexible during a bending process in the preparation process.

Figure 8:
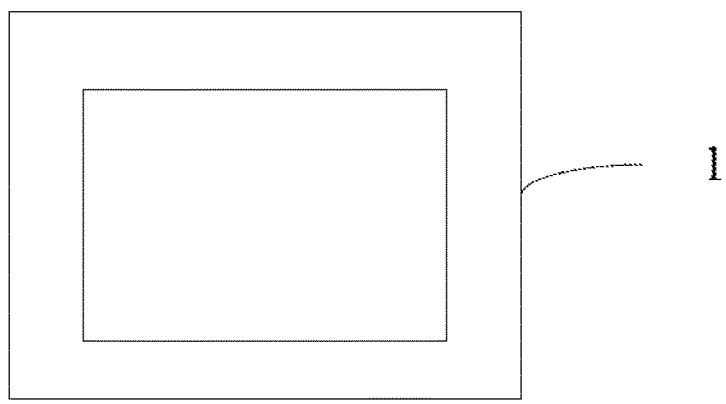
FIG. 8 is a structural illustration of a flexible display in accordance with an embodiment in the present disclosure.

In order to solve the above-mentioned technical problem, a technical solution further adopted by the present disclosure is to provide a flexible display. Referring to FIG. 8, FIG. 8 is a structural illustration of a flexible display in accordance with an embodiment in the present disclosure. The flexible display 1 may adopt the preparation method of the above-mentioned flexible display, and the method may be simple and beneficial to reduce the cost of the flexible display and improve the product quality.

In summary, the present disclosure provides bonding the first surface of the first substrate on the second substrate by the adhesive layer on the first surface and providing a flexible display body on the second surface of the first substrate, so that the flexible display may be firmly bonded with the second substrate. The adhesive used in the adhesive layer may have the property of hygroscopic swell, the internal structure of the adhesive layer may be broken after absorbing water, and the bonding force between the first substrate and the second substrate may become weakened, so that it may be easy to fast and efficiently peel off the first substrate and the second substrate of the flexible display, and the preparation process may be simplified, and the product quality may be improved.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A preparation method of a flexible display, comprising:
providing a first substrate comprising a first surface and a second surface opposite to the first surface, and providing a second substrate comprising a third surface, wherein the first substrate is smaller than the second substrate;
coating an adhesive on the first surface of the first substrate to form an adhesive layer, wherein the adhesive comprises silicon-modified polyurethane prepolymer, a hydrophilic plasticizer, a mixed filler, and a silane coupling agent;
bonding the first substrate on the third surface of second substrate by the adhesive layer on the first surface;
providing a flexible display body on the second surface of the first substrate;
separating the second substrate from the first substrate by a hygroscopic swelling to obtain the flexible display;
the hydrophilic plasticizer being polypropylene glycol 2000; the mixed filler comprising: nano calcium carbonate and heavy calcium carbonate, wherein the adhesive layer has a thickness of 3-10 micrometers; and
a material of the first substrate being at least one of polyimide, polyethylene naphthalate, polyethylene terephthalate, a fiber reinforced plastic, a polyether sulfone resin, polyarylate, and polycarbonate; the second substrate being at least one of a glass substrate, a metal substrate, a quartz substrate, and an organic substrate.

2. The method according to claim 1, wherein a mass percentage of the silicon-modified polyurethane prepolymer is 25-30%, a mass percentage of the polypropylene glycol 2000 is 15%-20%, and a mass percentage of the nano calcium carbonate and heavy calcium carbonate is 50%-60%, a mass percentage of the silane coupling agent is 0-2%; the adhesive further comprises a antioxidant, and a mass percentage of the antioxidant is 0-1%.

3. The method according to claim 1, wherein the providing the flexible display body on the second surface of the first substrate comprises:
providing at least one of a planarization layer and a water-and-oxygen barrier layer on the second surface of the first substrate;
providing the flexible display body on the at least one of the planarization layer and the water-and-oxygen barrier layer;
the providing the at least one of the planarization layer and the water-and-oxygen barrier layer on the second surface of the first substrate comprising:
providing the at least one of the planarization layer and the water-and-oxygen barrier layer on the second surface of the first substrate and the third surface of the second substrate, wherein side surfaces of the first substrate are covered by the at least one of the planarization layer and the water-and-oxygen barrier layer.

4. The method according to claim 3, before the separating the second substrate from the first substrate by the hygroscopic swelling to obtain the flexible display comprising:
cutting the at least one of the planarization layer and the water-and-oxygen barrier layer at a position where the side surfaces of the first substrate extend to the third surface, to form a incision having an angle with the second surface of the first substrate, wherein the angle is 30-60 degrees.

5. The method according to claim 1, wherein the separating the second substrate from the first substrate by the hygroscopic swelling to obtain the flexible display comprises:
submerging the flexible display body with the first substrate and the second substrate in water, to separate the second substrate from the first substrate, and obtaining the flexible display body with the first substrate, wherein a temperature of the water is 40-60° C.

6. The method according to claim 1, wherein a porous structure penetrating the second substrate is arranged on the second substrate;
the bonding the first substrate on the third surface of the second substrate by the adhesive layer on the first surface comprises:

sealing the porous structure on the second substrate; and
bonding the first substrate on the third surface of the second substrate with the porous structure sealed by the adhesive layer on the first surface.

7. The method according to claim 6, wherein the separating the second substrate from the first substrate by the hygroscopic swelling to obtain the flexible display comprises:
unsealing the porous structure on the second substrate after bonding the first substrate on the third surface of the second substrate.

8. A preparation method of a flexible display, comprising:
providing a first substrate comprising a first surface and a second surface opposite to the first substrate, and providing a second substrate comprising a third surface, wherein the first substrate is smaller than the second substrate;
coating an adhesive on the first surface of the first substrate to form an adhesive layer, and the adhesive comprising silicon-modified polyurethane prepolymer, a hydrophilic plasticizer, a mixed filler, and a silane coupling agent;
bonding the first substrate on the third surface of the second substrate by the adhesive layer on the first surface;
providing a flexible display body on the second surface of the first substrate; and
separating the second substrate from the first substrate by a hygroscopic swelling to obtain the flexible display.

9. The method according to claim 8, wherein the hydrophilic plasticizer is polypropylene glycol 2000; the mixed filler comprises: nano calcium carbonate and heavy calcium carbonate.

10. The method according to claim 8, wherein the adhesive layer has a thickness of 3-10 micrometers.

11. The method according to claim 9, wherein a mass percentage of the silicon-modified polyurethane prepolymer is 25-30%, a mass percentage of the polypropylene glycol 2000 is 15%-20%, and a mass percentage of the nano calcium carbonate and heavy calcium carbonate is 50%-60%, a mass percentage of the silane coupling agent is 0-2%; the adhesive further comprises a antioxidant, and a mass percentage of the antioxidant is 0-1%.

12. The method according to claim 8, wherein the providing the flexible display body on the second surface of the first substrate comprises:
providing at least one of a planarization layer and a water-and-oxygen barrier layer on the second surface of the first substrate;
providing the flexible display body on the at least one of the planarization layer and the water-and-oxygen barrier layer; and
the providing the at least one of the planarization layer and the water-and-oxygen barrier layer on the second surface of the first substrate comprising:
providing the at least one of the planarization layer and the water-and-oxygen barrier layer on the second surface of the first substrate and the third surface of the second substrate, wherein side surfaces of the first substrate are covered by the at least one of the planarization layer and the water-and-oxygen barrier layer.

13. The method according to claim 12, before the separating the second substrate from the first substrate by the hygroscopic swelling to obtain the flexible display comprising:
cutting the at least one of the planarization layer and the water-and-oxygen barrier layer at a position where the side surfaces of the first substrate extend to the third surface, to form a incision having an angle with the second surface of the first substrate, wherein the angle is 30-60 degrees.

14. The method according to claim 8, wherein the separating the second substrate from the first substrate by the hygroscopic swelling to obtain the flexible display comprising:
submerging the flexible display body with the first substrate and the second substrate in water, to separate the second substrate from the first substrate, and obtaining the flexible display body with the first substrate.

15. The method according to claim 8, wherein a temperature of the water is 40-60° C.

16. The method according to claim 8, wherein a porous structure penetrating the second substrate is arranged on the second substrate;
the bonding the first substrate on the third surface of the second substrate by the adhesive layer on the first surface comprises:
sealing the porous structure on the second substrate; and
bonding the first substrate on the third surface of the second substrate with the porous structure sealed by the adhesive layer on the first surface.

17. The method according to claim 16, wherein the separating the second substrate from the first substrate by the hygroscopic swelling to obtain the flexible display comprises:
unsealing the porous structure on the second substrate after bonding the first substrate on the third surface of the second substrate.

18. The method according to claim 8, wherein a material of the first substrate is at least one of polyimide, polyethylene naphthalate, polyethylene terephthalate, a fiber reinforced plastic, a polyether sulfone resin, polyarylate, and polycarbonate.

19. The method according to claim 8, wherein the second substrate is at least one of a glass substrate, a metal substrate, a quartz substrate, and an organic substrate.

* * * * *